(12) United States Patent
Kai et al.

(10) Patent No.: US 7,960,029 B2
(45) Date of Patent: Jun. 14, 2011

(54) OPTICAL FILTER FOR DISPLAY, AND DISPLAY AND PLASMA DISPLAY PANEL PROVIDED WITH THE OPTICAL FILTER

(75) Inventors: Masashi Kai, Kanagawa (JP); Toshio Nagai, Kanagawa (JP); Yuji Suzuki, Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 224 days.

(21) Appl. No.: 12/447,474

(22) PCT Filed: Nov. 2, 2007

(86) PCT No.: PCT/JP2007/071399
§ 371 (c)(1),
(2), (4) Date: Apr. 28, 2009

(87) PCT Pub. No.: WO2008/053989
PCT Pub. Date: May 8, 2008

(65) Prior Publication Data
US 2010/0073764 A1 Mar. 25, 2010

(30) Foreign Application Priority Data

Nov. 2, 2006 (JP) .................................. 2006-298770
Oct. 19, 2007 (JP) .................................. 2007-272257

(51) Int. Cl.
*B32B 9/04* (2006.01)
(52) U.S. Cl. ...................... 428/448; 428/195.1; 428/201; 428/210; 428/304.4; 428/353; 428/446; 428/450
(58) Field of Classification Search ................. 428/41.8, 428/195.1, 201, 210, 304.4, 353, 446, 448, 428/450
See application file for complete search history.

(56) References Cited

U.S. PATENT DOCUMENTS

| 6,548,177 | B2 * | 4/2003 | Hieda et al. | 428/441 |
| 6,991,849 | B2 * | 1/2006 | Oya | 428/353 |
| 7,796,327 | B2 * | 9/2010 | Sasaki | 359/360 |
| 2006/0154092 | A1 * | 7/2006 | Naito et al. | 428/457 |
| 2007/0231587 | A1 * | 10/2007 | Naito et al. | 428/457 |
| 2009/0133922 | A1 * | 5/2009 | Okazaki et al. | 174/389 |

FOREIGN PATENT DOCUMENTS

| JP | 62-215202 A | 9/1987 |
| JP | 11-74683 A | 3/1999 |
| JP | 2001-332889 A | 11/2001 |
| JP | 2003-92490 A | 3/2003 |
| JP | 2003-98339 A | 4/2003 |
| JP | 2005-175061 A | 6/2005 |
| JP | 2005-175217 A | 6/2005 |
| JP | 2006-191011 A | 7/2006 |

* cited by examiner

*Primary Examiner* — Gwendolyn Blackwell
(74) *Attorney, Agent, or Firm* — Sughrue Mion, PLLC

(57) ABSTRACT

To provide an optical filter for a display which can be easily prepared, which is thin and light, which has excellent electromagnetic wave shielding property and antireflection property, and which scarcely suffers from occurrence of interference fringe. An optical filter for display comprising at least one transparent film, a mesh-shaped conductive layer provided on the one transparent film, and a hard coat layer provided on the mesh-shaped conductive layer, wherein an intermediate layer is further provided between the transparent film and the mesh-shaped conductive layer, and the intermediate layer has refractive index of 1.60 to 1.80 and contact angle of 70 to 100 degrees.

20 Claims, 2 Drawing Sheets

OPTICAL FILTER FOR DISPLAY, AND DISPLAY AND PLASMA DISPLAY PANEL PROVIDED WITH THE OPTICAL FILTER

BACKGROUND OF INVENTION

1. Field of the Invention

The present invention relates to an optical filter for adding various functions such as antireflection, near-infrared shielding and electromagnetic wave shielding to various displays such as plasma display panel (PDP), cathode-ray-tube (CRT) display, liquid crystal display, organic EL (electroluminescence) display and field emission display (FED) including surface-conduction electron-emitter display (SED), and a display provided with the optical filter, particularly PDP.

2. Description of the Related Art

In flat-panel displays such as liquid crystal display, plasma display panel (PDP) and organic EL display, and CRT display, the problem that external light is reflected on a surface of the display to have difficult seeing visual information of the display has been known. Therefore, various countermeasures including provision of various optical films such as an antireflection film on the displays are taken.

In recent years, image magnification has entered the mainstream of the displays, and use of PDP and liquid crystal display have been generalized. PDP has advantages such as rapid response speed compared with the liquid crystal display. However, high-frequency pulse discharge is carried out in the light emitting part of the PDP for displaying image, and therefore unnecessary electromagnetic waves or infrared rays causing malfunction of infrared remote control are possibly radiated. Thus, as for the PDP, various antireflection films (electromagnetic wave shielding and light transmissive materials) having electric conductivity for PDP are proposed. Examples of the electromagnetic wave shielding light transmitting materials include (1) a transparent film having a metallic silver-containing transparent conductive thin layer thereon; (2) a transparent film having a conductive mesh layer consisting of network-patterned metallic wire or conductive fiber thereon; (3) a transparent film having network-patterned copper foil layer obtained by etching-processing copper foil so as to have opening parts thereon; (4) a transparent film having a mesh-shaped conductive ink layer formed by printing thereon.

However, the transparent conductive film (1) does not have sufficient high conductivity, and the conductive mesh (2) does not have generally sufficient high transparency. The etching-processing (3) and pattern printing (4) bring about formation of desired mesh-pattern conductive layer, and therefore have highly increased freedom in line width, line interval and pattern of the mesh compared with the conductive mesh (2). Hence, the etching-processing (3) and pattern printing (4) enable formation of a mesh-pattern conductive layer having high opening ratio such as 75% or more and fine line such as 200 μm or less. However, the etching-processing (3) requires expensive system (equipment) and involved process to bring about high production costs. On the other hand, the mesh-pattern printing (4) facilitates formation of the above-mentioned conductive layer, and therefore if a conductive layer having fine line and large mesh can be formed by mesh-pattern printing (4), the conductive layer has excellent light transmission and free from moire phenomenon. However, the pattern printing of conductive ink (4) requires high viscosity for maintaining good dispersion condition of conductive particles in an ink, and hence it is impossible to extremely reduce line width of ink and extremely increase opening ratio.

As the electromagnetic wave shielding light transmissive material, for example, patent document 1 (JP11-074683-A) describes an electromagnetic wave shielding light transmissive material obtained by placing the conductive mesh (mesh-shaped metal foil) (3) between two transparent plates and bonding them by transparent adhesive resin to unit them. The adhesive is thermoplastic resin such as ethylene/vinyl acetate copolymer (EVA).

In order to extremely enhance the opening ratio, patent document 2 (JP2001-332889-A) discloses a process for forming a mesh-shaped conductive layer wherein the mesh-pattern printing (4) is improved. The process is capable of preparing an electromagnetic wave shielding light transmissive material having sufficiently reduced line width of ink and extremely increased opening ratio, and the process comprises forming dots on a surface of a film by using conductive material soluble in water, forming a conductive material layer comprising conductive material insoluble in water on the surface of the film, and bringing water in contact with the surface of the film to remove the dots and the conductive material layer on the dots (hereinafter referred to as "printing mesh process").

Patent document 1: JP 11-074683-A
Patent document 2: JP2001-332889-A

DISCLOSURE OF THE INVENTION

Problem to be Solved by the Invention

As enclosed in patent document 1, an electromagnetic wave shielding light transmissive material is obtained by placing mesh-shaped metal foil between two transparent plates and bonding them by transparent adhesive resin to unit them, the transparent adhesive resin being used for fixing the mesh-shaped metal foil between two transparent plates and thermoplastic resin such as ethylene/vinyl acetate copolymer (EVA) being used as the transparent adhesive resin. Further, a mesh-shaped conductive layer formed by the printing mesh process described in patent document 2 is directly provided on a film.

In contrast, it is desired to render continuous and easy the preparation of an optical filter such as an electromagnetic wave shielding light transmissive material. For instance, the desire will be accomplished by forming on one transparent film various function layers such as a mesh-shaped conductive layer, an antireflection layer including a hard coat layer and a near-infrared absorption layer. In a simplest example of the processes for the preparation, a mesh-shaped conductive layer is formed on a transparent film, and a hard coat layer and an antireflection layer are formed on the mesh-shaped conductive layer by coating method.

It has been revealed that when an intermediate layer (e.g., resin layer) is formed between the mesh-shaped metal foil and the transparent plates mentioned above in order to enhance adhesion therebetween, the resultant optical filter suffers from occurrence of interference fringe (moire fringe). Further, in case the intermediate layer is formed from thermoplastic resin, it is apt to have insufficient solvent resistance. Therefore if a hard coat layer is formed on such intermediate layer (and a mesh-shaped conductive layer), the hard coat layer damages the intermediate layer, which apparently renders the enhanced adhesion insufficient and reduces the transparency.

Thus, the object of the present invention is to provide an optical filter for display which can be easily prepared, which is thin and light, which has excellent electromagnetic wave shielding property and antireflection property, and which scarcely suffers from occurrence of interference fringe.

Further, the object of the present invention is to provide an optical filter for display which can be easily prepared, which is thin and light, which has excellent electromagnetic wave shielding property and antireflection property and high opening ratio, and which scarcely suffers from occurrence of interference fringe.

Furthermore, the object of the present invention is to provide an optical filter for display which can be easily prepared, which is thin and light, which has excellent electromagnetic wave shielding property and antireflection property and improved durability, and which scarcely suffers from occurrence of interference fringe.

Still, the object of the present invention is to provide an optical filter suitable for PDP which can be easily prepared, which is thin and light, which has excellent electromagnetic wave shielding property and antireflection property, and which scarcely suffers from occurrence of interference fringe.

Further, the object of the present invention is to provide a display wherein the optical filter for display having excellent properties mentioned above is attached onto a surface of the glass plate for displaying image of the display.

Further, the object of the present invention is to provide a plasma display panel (PDP) wherein the optical filter for display having excellent properties mentioned above is attached onto a surface of the glass plate for displaying image of the display.

Means for Solving Problem

The study of the present inventors has revealed that in case a mesh-shaped conductive layer is formed on a transparent film by using the "printing mesh process" described in Patent Document 2, it is effective to use, as an intermediate layer enhancing adhesion between the transparent film and the mesh-shaped conductive layer, a layer having its surface contact angle of 70 to 100 degrees in addition to the above-mentioned adhesion. In more detail, in the "printing mesh process", when dots comprising material soluble in water are formed on a surface of a film, the dots can be rendered sharp-cut by adjusting angle of a sidewall of each dot with respect to the surface of the film to approximately vertical direction. The present inventors have found that such sharp-cut dots can be obtained by adjusting contact angle of a surface of the intermediate layer to 70 to 100 degrees. Further, this contributes enhancement of opening ratio.

Although, an easily manufacturable optical film comprising one transparent film and a mesh-shaped conductive layer, a hard coat layer and an antireflective layer provided on the film in this order, suffers from occurrence of interference fringe, the present inventors have clarified that the occurrence of interference fringe is attributed to low refractive index of the intermediate layer. Also, it is clarified that solvent resistance of the intermediate layer is improved by use of the specific curable resin.

Thus, the present invention can be provided by an optical filter for display comprising at least one transparent film, a mesh-shaped conductive layer provided on the one transparent film, and a hard coat layer provided on the mesh-shaped conductive layer, wherein an intermediate layer is further provided between the transparent film and the mesh-shaped conductive layer, and the intermediate layer has refractive index of 1.60 to 1.80 and contact angle of 70 to 100 degrees; and an optical filter for display comprising a transparent film, a mesh-shaped conductive layer and a hard coat layer provided on one side of the transparent film in this order, and a near-infrared absorption layer provided on the other side of the transparent film, wherein an intermediate layer is further provided between the transparent film and the mesh-shaped conductive layer, and the intermediate layer has refractive index of 1.60 to 1.80 and contact angle of 70 to 100 degrees.

The refractive index is determined in accordance with JIS Z 8120 (2001). The contact angle is determined in accordance with JIS R 3257-01(1999).

The embodiments of the optical filter for display according to the present invention are described as follows:

(1) The refractive index of the intermediate layer is in the range of 1.60 to 1.70. Particularly the occurrence of interference fringe can be effectively prevented.

(2) The contact angle of the intermediate layer is in the range of 70 to 90 degrees. Particularly sharp-cut dots can be easily obtained.

(3) The optical filter for display has haze value of not more than 5%.

(4) The intermediate layer contains polyester urethane resin, silicone and metal oxide having high refractive index. The polyester urethane resin preferably is a cured product obtained from polyester resin and isocyanate compound.

(5) The mesh-shaped conductive layer has a thickness of 1 to 10 μm, preferably 2 to 8 μm, especially 3 to 6 μm. The depressed (recess) portions of the mesh-shaped conductive layer can be easily covered completely with the hard coat layer.

(6) The mesh-shaped conductive layer is a layer including a vapor-deposited layer of metal. A conductive layer formed by application (coating) may be used. This conductive layer is, for example, a coating layer of conductive particles of inorganic compound dispersed in polymer. Further, the mesh-shaped conductive layer may be a combination of the vapor-deposited layer of metal or the coating layer and a metallic deposit (plated layer).

The mesh-shaped conductive layer is preferably and advantageously formed by the process (so-called "printing mesh process") wherein dots are formed on a surface of a film by using conductive material soluble in a solvent such as water, a conductive material layer comprising conductive material insoluble in the solvent is formed on the surface of the film by coating or vapor deposition, and the solvent is brought in contact with the surface of the film to remove the dots and the conductive material layer on the dots.

(7) A low refractive index layer having refractive index lower than that of the hard coat layer is formed on the hard coat layer. Thereby excellent antireflection property can be obtained.

(8) An adhesive layer is provided on the side opposite to the transparent film side of the near-infrared absorption layer. It becomes easy to equip a display with the filter. The near-infrared absorption layer may have adherence property.

(9) The transparent film is a plastic film.

(10) A release sheet is provided on the adhesive layer or the near-infrared absorption layer having adherence property. It becomes easy to equip a display with the filter.

(11) The optical filter for display is an optical filter for plasma display panel.

Further, the present invention can be provided by an optical filter for display comprising at least one transparent film, a mesh-shaped conductive layer provided on the one transparent film, and a hard coat layer provided on the mesh-shaped conductive layer, wherein an intermediate layer is further provided between the transparent film and the mesh-shaped conductive layer, and the intermediate layer is a cured product obtained from a mixture comprising polyester resin, isocyanate compound, silicone and metal oxide; and an optical filter for display comprising a transparent film, a mesh-shaped conductive layer and a hard coat layer provided on one side of the transparent film in this order, and a near-infrared absorption layer provided on the other side of the transparent film, wherein an intermediate layer is further provided between the transparent film and the mesh-shaped conductive layer, and the intermediate layer is a cured product obtained from a mixture comprising polyester resin, isocyanate compound, silicone and metal oxide.

The embodiments (4) to (10) as stated previously are applied to the aforementioned optical filters for display. Moreover, the isocyanate compound preferably is polyisocyanate having two or more isocyanate groups in its molecule.

Furthermore, the present invention can be provided by a display wherein the optical filter for display as defined above is attached onto a surface of a glass plate for displaying image; and a plasma display panel wherein the optical filter for display as defined above is attached onto a surface of a glass plate for displaying image.

Effect of the Invention

The optical filter for display of the present invention has advantages that can be easily prepared, that is thin and light, that has excellent electromagnetic wave shielding property and antireflection property, and that scarcely suffers from occurrence of interference fringe. In the invention, in case a mesh-shaped conductive layer is formed on a transparent film by using the "printing mesh process", the intermediate layer having contact angle of 70 to 100 degrees is formed on the transparent film so as to obtain sharp-cut dots. Simultaneously the intermediate layer is also designed to have high refractive index of the specified range to prevent occurrence of interference fringe and to serve as one layer constituting an antireflection layer. Thereby even a small number of layers constituting the optical filter bring about excellent antireflection property and prevention of interference fringe. Further the mesh-shaped conductive layer having high opening ratio can be easily obtained.

Since the intermediate layer has the two functions mentioned above, the formation of the intermediate layer enables to use only the one film instead of two films of a mesh-shaped conductive film and an antireflection film. Hence the optical filter having the intermediate layer can be reduced in thickness and weight, which renders handling on and after attached to a display extremely easy.

In addition, in case the intermediate layer is formed from a layer including a cured product formed from polyester resin and isocyanate compound, adhesion between the mesh-shaped conductive layer and the transparent film is extremely enhanced and simultaneously the solvent resistance of the intermediate layer is especially improved. Therefore, when a hard coat layer is formed on the intermediates layer, the hard coat layer does not damage the intermediates layer and also the intermediates layer maintains the enhanced adhesion not to suffer from reduction of transparency, which does not bring about reduction of productivity.

Thus the optical filter for display of the invention is capable of adding various functions such as antireflection, near-infrared shielding and electromagnetic wave shielding to various displays such as plasma display panel (PDP), cathode-ray-tube (CRT) display, liquid crystal display, organic EL (electroluminescence) display, field emission display (FED) including surface-conduction electron-emitter display (SED), and has high productivity.

EXPLANATION OF REFERENCE NUMBER

| 11 | Optical filter for display |
| 12 | Transparent film |
| 13 | Intermediate layer |
| 14 | Mesh-shaped conductive layer |
| 15 | Hard coat layer |
| 16 | Antireflection layer |
| 17 | Near-infrared absorption layer |
| 18 | Adhesive layer |

DESCRIPTION OF PREFERRED EMBODIMENTS

The optical filter for display having antireflection property and scarcely suffering from occurrence of interference fringe according to the present invention is explained in detail below.

Figure 1:
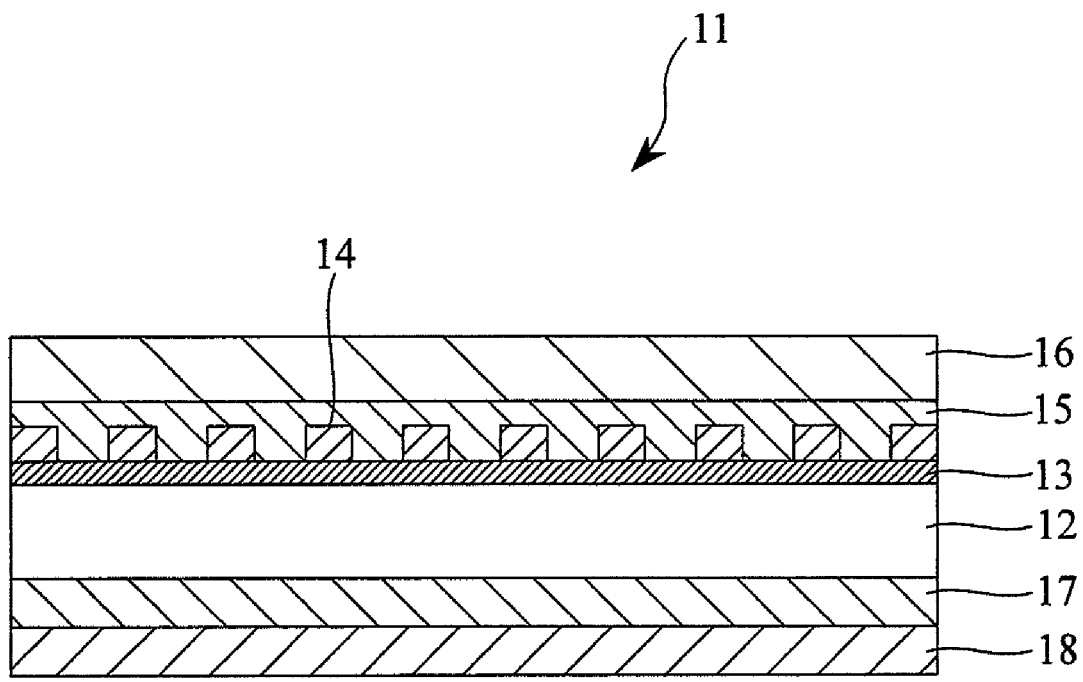
FIG. 1 is a schematic section view showing an example of a basic structure of the optical filter for display according to the present invention.

A schematic section view of an example of a basic structure of the optical filter for display according to the present invention is shown in FIG. 1. An intermediate layer 13, a mesh-shaped conductive layer 14, a hard coat layer 15 and an antireflection layer 16 such as a low refractive index layer are formed on an one side of a transparent film 12 in this order, and, a near-infrared absorption layer 17 and an adhesive layer 18 is formed on the other side (back side) of the transparent film 12. The antireflection layer 16 of this structure may not be provided though no provision of antireflection layer brings about a little reduction of antireflection property. In case the near-infrared interruption property is not required, the near-infrared absorption layer 17 and an adhesive layer 18 may not be provided.

The intermediate layer 13 has refractive index of 1.60 to 1.80, preferably of 1.60 to 1.70, and contact angle of 70 to 100 degrees, preferably 70 to 90 degrees. Since the intermediate layer has the above-defined contact angle, the mesh-shaped conductive layer formed on a transparent film by using the "printing mesh process" comes to have sharp-cut dots. Since the intermediate layer is configured to have high refractive index of the above-defined range, it prevents occurrence of interference fringe and also comes to serve as one layer constituting an antireflection layer.

The occurrence of interference fringe can be generally prevented by configuring the intermediate layer to have the same refractive index as that of the transparent film or hard coat layer or to have so refractive index as to compensate phase difference of λ/4. The occurrence of interference fringe can be effectively prevented by configuring the intermediate layer to have the above-defined refractive index.

Further, since the intermediate layer I is configured to have the above-defined contact angle, side walls of dots made of an aqueous resin such as PVA formed on a transparent film by using the "printing mesh process" is apt to be approximately vertical, which easily brings about sharp-cut dots. Simultaneously, adhesion between the intermediate layer and the hard coat thereon is also excellent. Such intermediate layer generally includes resin having excellent adhesion (e.g., polyester urethane resin), additives for enhancing contact angle (e.g., silicone), and materials for enhancing refractive index (e.g., metal oxide). Particularly, by using, as the intermediate layer, a layer of cured product formed from a mixture including polyester resin, isocyanate compound, silicone and metal oxide, the intermediate layer is extremely improved in adhesion and solvent resistance. Thus the optical filter having the above-mentioned properties and scarcely suffering from occurrence of interference fringe can be obtained in high productivity. The details are explained later.

For example, if the intermediate layer easily suffering from damage by organic solvent is provided between the transparent film and the mesh-shaped conductive layer, the intermediate layer is damaged by organic solvent and the like contained in a coating liquid for first function layer (e.g., hard coat layer) when the coating liquid is coated on the intermediate layer, which renders the first function layer cloudy to increase the haze value. Thus, the intermediate layer preferably has improved solvent resistance, which is, for example, brought about by crosslinking.

As mentioned above, even the optical filter having the first function layer formed by using the coating liquid preferably has high transparency without damage by organic solvent and the like. In more detail, the optical filter preferably has haze value of not more than 5%. The haze value of the optical filter can be determined by using Full Automatic Direct-Reading Haze Computer HGM-2DP manufactured by Suga Shikenki K. K. according to JIS K 7105 (1981).

The mesh-shaped conductive layer 14 is, for example, a mesh-shaped metal layer or metal-containing layer. The mesh-shaped metal layer or metal-containing layer is generally a layer formed by etching process or printing process. In the invention, the mesh-shaped conductive layer is preferably formed by the printing process, especially the above-mentioned printing mesh process, whereby a high opening ratio and low resistance can be easily obtained. The depressed portions (openings) of the mesh-shaped metal layer or metal-containing layer are generally filled with the function layer such as the hard coat layer as shown in FIG. 1, whereby enhanced transparent can be obtained.

The mesh-shaped conductive layer 14 of the invention is preferably a thin layer formed by the printing process, so-called the printing mesh process. Though the mesh-shaped conductive layer generally is a layer including a vapor-deposited layer of metal, the conductive layer may be formed by application (coating). The coated conductive layer is, for example, a coating layer of conductive particles of inorganic compound dispersed in polymer. Further, the mesh-shaped conductive layer may be a combination of the vapor-deposited layer of metal or the coating layer and a metallic deposit (plated layer) provided thereon.

The mesh-shaped conductive layer has generally a thickness of 1 to 10 μm, preferably 2 to 8 μm, especially 3 to 6 μm. Such mesh-shaped conductive layer has increased opening ratio and hence is capable of enhancing brightness of image area of display. Further the depressed portions of the mesh-shaped conductive layer can be advantageously filled with the function layer such as the hard coat layer.

The antireflection layer 16 generally is a low refractive index layer. In more detail, a composite layer of the hard coat layer 15 and the low refractive index layer provided thereon shows efficiently antireflection effect. A high refractive index layer may be provided between the hard coat layer 15 and the low refractive index layer to further enhance the antireflection effect.

The antireflection layer 16 may not be provided, and only the hard coat layer 15 which has lower or higher (preferably lower) refractive index than that of the transparent film, may be provided. The hard coat layer 15 and the antireflection layer 16 are preferably formed by application in view of productivity and economic efficiency.

The near-infrared absorption layer 17 has function that shields (cuts) undesired light such as neon light of PDP. The layer generally contains a dye having absorption maximum of 800 to 1200 nm. The adhesive layer 18 is generally provided to be easily attached to a display. The release sheet may be provided on the adhesive layer.

The optical filter for display of the invention is obtained, for example, by forming on a surface of a continuous transparent film, an intermediate layer, a mesh-shaped conductive layer, a hard coat layer and an antireflection layer, and forming a near-infrared absorption layer and an adhesive layer on the other surface of the continuous transparent film; or by forming a continuous transparent film having a mesh-shaped conductive layer and a continuous transparent film having a near-infrared absorption layer, laminating these films through an adhesive; to prepare a continuous optical filter, and then cutting the prepared filter according to a rectangle shape depending on the shape of displaying area of front side of each display In case of using a rectangle-shaped transparent film, each of the layers may be formed in batch wise, but it is preferred that each of the layers is formed continuously, generally in roll-to-roll method, and cut.

Materials used in the optical filter for display of the present invention are explained below.

The transparent film is generally a transparent plastic film. Though the materials may be anything having transparency (the transparency meaning transparency to visible light), a plastic film is generally used.

Examples of materials of the plastic film include polyester such as polyethylene terephthalate (PET) and polybutylene terephthalate, acrylic resin such as polymethyl methacrylate (PMMA), polycarbonate (PC), polystyrene, cellulose triacetate, polyvinyl alcohol, polyvinyl chloride, polyvinylidene chloride, polyethylene, ethylene-vinyl acetate copolymer, polyvinyl butyral, metal-crosslinked ethylene-methacrylic acid copolymer, polyurethane and cellophane. Preferred are polyethylene terephthalate (PET), polycarbonate (PC), polymethyl methacrylate (PMMA), because have high resistance to processing load such as heat, solvent and bending and high transparency. Especially PET is preferred because of excellent processing properties.

The transparent film has generally a thickness of 1 μm to 10 mm, preferably 1 μm to 5 mm, particularly 25 to 250 μm depending upon the application of the optical filter.

The metal conductive layer of the invention is set such that surface resistance value of the resultant optical filter generally is not more than 10Ω/□, preferably in the range of 0.001 to 5Ω/□, especially in the range of 0.005 to 5Ω/□.

As examples of the mesh-shaped (lattice-shaped) conductive layer formed by the printing mesh process as mentioned above, there can be mentioned a layer obtained by etching a metal (e.g., Cu) layer provided on a transparent film so as to form mesh having openings, and a layer obtained by printing an electrically conductive ink on a transparent film so as to form mesh.

The mesh of the mesh-shaped conductive layer preferably has line width of 1 µm to 1 mm and opening ratio of 40 to 95%. Further preferred is a mesh having line width of 10 to 500 µm and opening ratio of 50 to 95%. In the mesh-shaped conductive layer, line width more than 1 mm brings about enhanced electromagnetic wave shielding property, while opening ratio is reduced. Line width less than 1 µm brings about reduction of the strength of the resultant mesh to render its handling difficult. Moreover, opening ratio more than 95% renders keeping of the shape of the mesh difficult, while opening ratio less than 40% brings about reductions of optical transparency to lower light amount from a display.

The opening ratio (aperture ratio) of the mesh-shaped conductive layer means the proportion of the area of the opening portion of the layer to the projected area of the layer.

In a patternwise etched conductive foil such as metallic foil, as metals for the metallic foil, copper, stainless, aluminum, nickel, iron, brass or alloys thereof, preferably copper, stainless or aluminum is used.

In case of decreasing the thickness of the metal foil to excess, handling of the foil and workability of pattern etching are reduced. In case of increasing the thickness to excess, a thickness of the resultant filter is increased and time period requiring for etching procedure is lengthened. Therefore the thickness of the conductive layer preferably is in the range of 1 to 200 µm.

The etched pattern may have any shapes. For example, the metallic foil is in the form of stripe, which is obtained by forming square openings (pores) on the foil, or in the form of punching metal, which is obtained by forming circle, hexagon, triangle or ellipse openings. The openings may be regularly arranged or irregularly arranged to have a random pattern. The opening ratio (the proportion of the area of the opening portion to the projected area) of the metal foil is preferably in the range of 20 to 95%.

Alternatively, the mesh-shaped conductive layer may be formed by printing a conductive ink in the form of pattern. As the conductive ink, the following ink can be used, and the printing can be carried out by using an inkjet printing process, an electrostatic printing process.

The conductive ink generally includes 50 to 90% by weight of conductive material particles such as carbon black particles having particle size of not more than 100 µm, or particles of metal (e.g., copper, aluminum, nickel) or alloys and a binder resin such as PMMA, polyvinyl acetate or epoxy resin for dispersing the particles. The conductive ink is diluted or dispersed in solvent such as toluene, xylene, methylene chloride and/or water, and the resultant liquid is coated by means of a printing process, and then, if desired, dried and fixed at temperature of room temperature to 120° C. In the same manner, conductive particles coated with binder resin thereon is coated by means of an electrostatic printing process, and fixed by heating.

The resultant printed layer preferably has a thickness of 0.5 to 100 µm, because too small thickness brings about reduction of electromagnetic shielding effect and too large thickness affects thickness of the film.

By using the above-mentioned pattern printing processes, a conductive layer having large freedom of pattern and having desired line width, pitch and opening shape can be formed. Therefore a plastic film having electromagnetic shielding property and light transmission (transparency) can be easily formed.

The patternwise-printed shape of the conductive layer may be any shape. For example, the printed layer is in the form of mesh (lattice) having square openings (pores), or in the form of punching metal having circle, hexagon, triangle or ellipse openings. The openings may be regularly arranged or irregularly arranged to have a random pattern. The opening ratio (the proportion of the area of the opening portion to the projected area) of the printed layer is preferably in the range of 20 to 95%.

In the invention, the mesh-shaped conductive layer is preferably formed by the "printing mesh process" as mentioned above.

Figure 2:
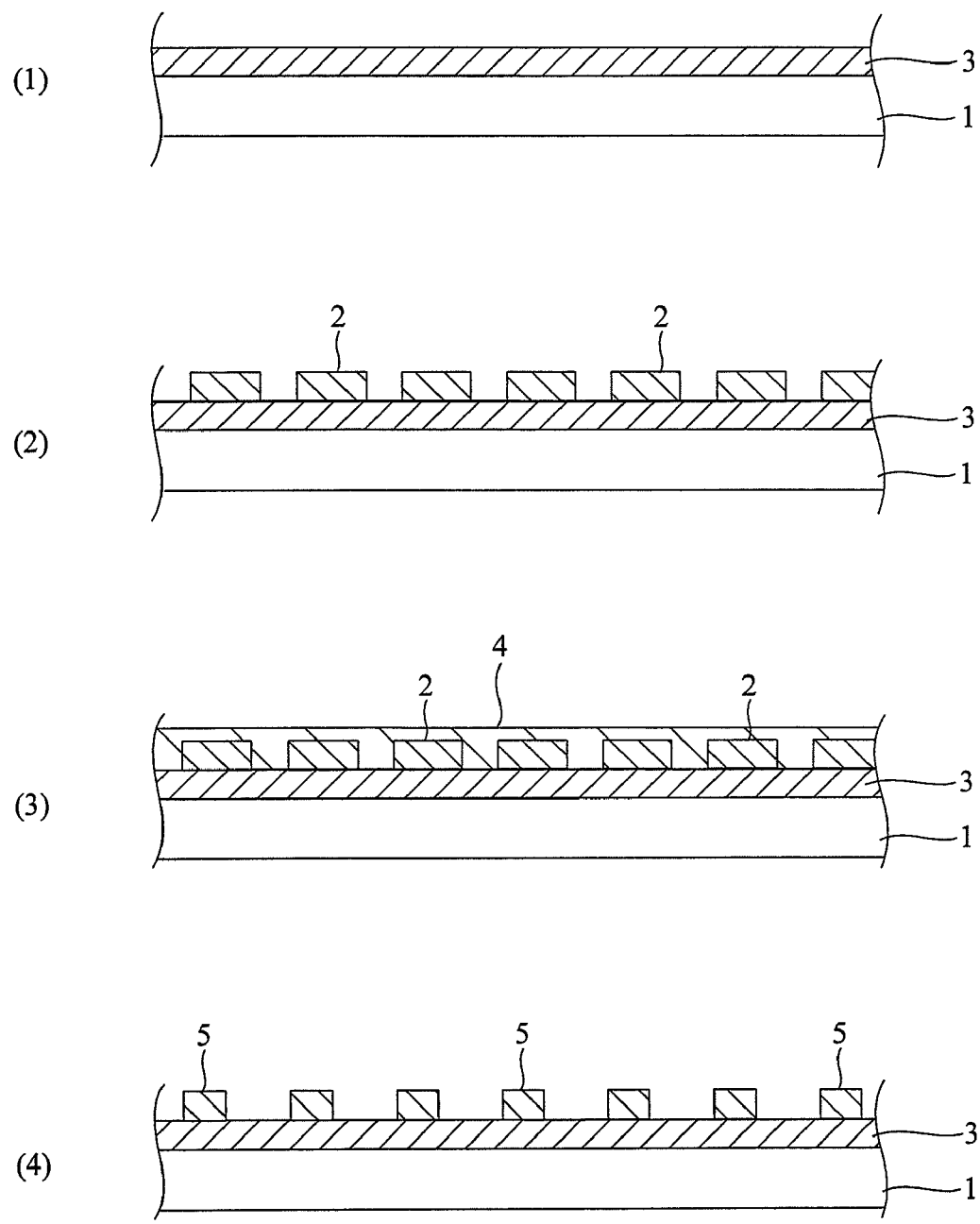
FIG. 2 is a schematic view for explaining the process for forming a mesh-shaped conductive layer by means of the "printing mesh process".

A schematic view for explaining the process for forming a mesh-shaped conductive layer by means of the printing mesh process is shown in FIG. 2. First, a coating liquid for intermediate layer is applied onto a transparent film 1 and dried, if necessary cured, to form an intermediate layer 3 (step (1)), and material soluble in solvent such as water is dot-wise printed on a surface of the intermediate layer 3 to form dots 2 (step (2)). The intermediate layer 3 of the invention has the contact angle of the specified high range, and hence the sidewalls of the printed dots are approximately vertical with respect to the surface of the intermediate layer whereby the dots are rendered sharp-cut. Subsequently, a conductive material layer 4 insoluble in the solvent is formed so as to cover the surfaces of the dots 2 and the exposed areas of the intermediate layer 3 between the dots (step (3)). Thus the conductive material layer 4 is also formed on the dots 2, and hence the conductive material layer 4 cannot be removed by the later washing step if its thickness is too large. Subsequently, the transparent film 1 is washed with the solvent such as water to dissolve the dots. In the washing step, means for promoting dissolution, for example, application of ultrasonic wave, rubbing with brush or sponge, may be used. The conductive material layer 4 is preferably formed by vapor deposition of metal to have low resistance.

By the washing step, the dots 2 soluble in the solvent are dissolved in the solvent and the conductive materials (conductive material layer 4) formed on the dots are also dissolved to be peeled and removed from the transparent film 1. Thus a conductive pattern (mesh-shaped conductive layer) 5 of the conductive materials formed between the dots remains on the transparent film 1 (step (4)). The conductive pattern 5 occupies the area between the dots, and hence the whole shape is mesh-shape.

Hence, the conductive pattern 5 in the form of mesh having small line width can be obtained by reduction of distances between the dots 2, whereas the conductive pattern 5 in the form of mesh having large opening ratio can be obtained by increase of distances (or areas) between the dots 2. Printing materials soluble in the solvent such as water is able to have low viscosity because they are not required to disperse particles. The use of the printing materials having low viscosity enables printing of minute dots which form fine dot pattern.

After the step (4), if necessary, the transparent film is subjected to rinsing treatment for finishing and dried to give a conductive layer.

The conductive layer formed by coating in the printing mesh process includes a coated layer having conductive particles of inorganic compound dispersed in polymer.

Examples of the inorganic compounds constituting the conductive particles include metals such as aluminum, nickel, indium, chromium, gold, vanadium, tin, cadmium, silver, platinum, copper, titanium, cobalt, lead or alloys thereof; or conductive metal oxide such as indium oxide, tin oxide, zinc oxide, indium oxide-tin oxide (ITO, i.e., indium-doped tin oxide), tin oxide-antimony oxide (ATO, i.e., antimony-doped tin oxide), zinc oxide-aluminum oxide (ZAO, i.e., aluminum-doped zinc oxide). Especially preferred is ITO. The mean particle size preferably is 10 to 10,000 nm, especially 10 to 50 nm.

Examples of the polymer include acrylic resin, polyester resin, epoxy resin, urethane resin, phenol resin, maleic acid resin, melamine resin, urea resin, polyimide resin and silicon-containing resin. Of these resins, those classified in thermosetting resins are preferred.

The provision of the coated conductive layer is generally carried out by preparing a coating liquid by dispersing the conductive particles in the polymer (and if desired, solvent) through mixing, applying the coating liquid to a substrate or the transparent film, and if desired dried and cured. In case of using thermoplastic resin, the layer can be obtained by the application and drying. In case of using thermosetting resin, the layer can be obtained by the application, drying and curing. Further, in case of using UV curable resin, the layer can be obtained by the application, if desired drying and exposure to ultraviolet light.

The coated conductive layer has preferably a thickness of 0.01 to 5 µm, especially 0.05 to 3 µm. When the thickness is less than 0.01 µm, the electromagnetic shielding effect is occasionally reduced. When the thickness is more than 5 µm, the transparency is occasionally reduced.

In case the conductive layer is provided by a film forming method by vapor in the printing mesh process shown in FIG. 2 (i.e., deposited metal layer), any vapor film forming methods can be used. Examples of the vapor film forming methods include sputtering, ion plating, electron beam deposition, vacuum deposition and chemical deposition. Preferred are the vapor film forming methods such as sputtering, ion plating, electron beam deposition, vacuum deposition and chemical deposition. In this case, the inorganic compound constituting the conductive particle mentioned previously is used to form the conductive layer. The conductive layer formed by the vapor film forming method has preferably a thickness of 0.1 to 10 µm, further 2 to 8 µm, especially 3 to 6 µm.

A plated layer of metal (metallic deposit) may be further provided on the metal conductive layer in order to enhance conductive property. The plated layer can be formed by conventional electrolytic plating and nonelectrolytic plating. Examples of metals used in the plating generally include copper, copper alloy, nickel, aluminum, silver, gold, zinc or tin. Preferred is copper, copper alloy, silver or nickel, and particularly copper or copper alloy is preferred in view of economic efficiency and conductive property.

Further antiglare property may be provided to the conductive layer. In case of performing the antiglare treatment, a blackened treatment may be carried out on a surface of the (mesh-shaped) conductive layer. For example, oxidation treatment of metal layer, black plating of chromium alloy, or application of black or dark color ink can be carried out.

The intermediate layer 3, 13 of the invention has refractive index of 1.60 to 1.80 and contact angle of 70 to 100 degrees. The refractive index is determined in accordance with JIS Z 8120 (2001). The contact angle is determined in accordance with JIS R 3257-01 (1999). The refractive index of the intermediate layer preferably is in the range of 1.60 to 1.70 and the contact angle preferably is in the range of 70 to 90 degrees. The refractive index of less than the lower limit does not sufficiently bring about control of occurrence of interference fringe, whereas the refractive index of more than the upper limit also shows the same inclination as the former. The contact angle of less than the lower limit reduces opening ratio, whereas the contact angle of more than the upper reduces wetting property of printing ink such as PVA to bring about increase of opening ratio and reduction of adhesion to the hard coat layer. The intermediate layer has generally a thickness of 10 to 1000 nm, preferably 10 to 500 nm, especially 10 to 200 nm.

Materials constituting the intermediate layer chiefly include 1) binder resin, 2) integrant for enhancing contact angle and 3) integrant for enhancing refractive index. If the 1) binder resin has the functions indicated in the 2) integrant and/or the 3) integrant, use of the 2) integrant and/or the 3) integrant can be omitted.

Examples of the 1) binder resin include acrylic resin, polyester resin, styrene-maleic acid grafted polyester resin, acrylic polymer grafted polyester resin, epoxy resin, urethane resin, phenol resin, maleic acid resin, melamine resin, and silicone resin. Preferred are acrylic resin, polyester resin and urethane resin. These resins may be thermoplastic or thermosetting resin. Those classified in thermosetting resin are preferred.

Preferred examples of the thermosetting resin include a combination of acrylic resin and/or polyester resin with polyisocyanate, and a combination of epoxy resin with hardener (acid anhydride, polyamine). Particularly, a combination of polyester resin with polyisocyanate is preferred. Further, examples of the binder resin having the functions indicated in the 2) integrant and/or the 3) integrant include silicone-modified acrylic resin.

The polyester resin is generally obtained by polycondensation of glycol and polybasic (generally dibasic) carboxylic acid. Examples of the glycol include ethylene glycol, diethylene glycol, propylene glycol, butanediol, hexanediol, 1,4-cyclohexanedimethanol, 2,2-dimethyl-1,3-propanediol (neopentyl glycol), 2-methyl-2-ethyl-1,3-propanediol, 2-methyl-2-butyl-1,3-propanediol, 2-methyl-2-propyl-1,3-propanediol, 2-methyl-2-isopropyl-1,3-propanediol, 2-methyl-2-n-hexyl-1,3-propanediol, 2,2-diethyl-1,3-propanediol, 2-ethyl-2-n-butyl-1,3-propanediol, 2-ethyl-2-n-hexyl-1,3-propanediol, 2,2-di-n-butyl-1,3-propanediol, 2-n-butyl-2-propyl-1,3-propanediol, 2,2-di-n-hexyl-1,3-propanediol. Preferred are ethylene glycol, diethylene glycol, propylene glycol, butanediol, hexanediol, 1,4-cyclohexanedimethanol, 2,2-dimethyl-1,3-propanediol.

Examples of polybasic (generally dibasic) carboxylic acid include aromatic dicarboxylic acids such as terephthalic acid, isophthalic acid, diphenylcarboxylic acid and 2,6-naphthalene dicarboxylic acid; adipic acid, succinic acid, malonic acid, glutaric acid, pimeric acid, suberic acid, azelaic acid, sebacic acid, fumaric acid, maleic acid. Preferred are terephthalic acid, isophthalic acid, adipic acid, succinic acid, azelaic acid, and sebacic acid. Anhydride or ester of the acid can be used, naturally.

Examples of the polyisocyanate include aromatic diisocyanates such as isomers of tolylene diisocyanate, 4,4'-diphenylmethane diisocyanate; aromaliphatic diisocyanates such as xylylene diisocyanate; cycloaliphatic diisocyanates such as isophorone diisocyanate, 4,4'-dicyclohexylmethane diisocyanate; aliphatic diisocyanates such as hexamethylene diisocyanate, 2,4,4'-trimethylhexamethylene diisocyanate; or polyisocyanates obtained by adding one or more of the polyisocyanate to trimethylol propane and the like.

As the 2) integrant for enhancing contact angle, silicone oils, silicone resins, silicone surfactants and fluoro surfactants (fluorochemical surfactants) can be appropriately selected and used.

The silicone oils are preferred. Examples include dimethyl silicone (Trade name: TF-96, KF-965, KF-968, KF-995; available from Shin-Etsu Chemical Co., Ltd.); methyl phenyl silicone (Trade name: TF-50, KF-54, KF-56; available from Shin-Etsu Chemical Co., Ltd.); methyl hydrogen silicone (Trade name: TF-99; available from Shin-Etsu Chemical Co., Ltd.).

Examples of silicone surfactants include silane compounds such as aminosilane, acrylicsilane, vinylbenzylsilane, glycidosilane, mercaptosilane and dimethylsilane; siloxane compounds such as polydimethylsiloxane, polyalkoxysiloxane, hydrogen-modified siloxane, vinyl-modified siloxane, hydroxy-modified siloxane, amino-modified siloxane, carboxyl-modified siloxane, halogen-modified siloxane, epoxy-modified siloxane, methacryloxy-modified siloxane, mercapto-modified siloxane, fluorine-modified siloxane, alkyl-modified siloxane, phenyl-modified siloxane and alkylene oxide-modified siloxane.

Examples of fluoro surfactants include perfluoroalkyl compounds such as 4-fluoroethylene, perfluoroalkyl ammonium salt, perfluoroalkyl sulfonamide, sodium perfluoroalkyl sulfonate, perfluoroalkyl potassium salt, perfluoroalkyl carboxylate salt, perfluoroalkyl sulfonate (salt), perfluoroalkyl ethylene oxide adducts, perfluoroalkyl trimethyl ammonium salt, perfluoroalkyl aminosulfonate salt, perfluoroalkyl phosphate ester, perfluoroalkyl alkylbetaine, perfluoroalkyl halide.

Examples of the 3) integrant for enhancing refractive index include conductive metal oxide particles (inorganic compound) such as ITO, ATO, $Sb_2O_5$, $Sb_2O_3$, $SbO_2$, $In_2O_3$, $SnO_2$, ZnO, $ZrO_2$, Al-doped ZnO, $TiO_2$. Even nonconductive metal oxide particles can be used if they have high refractive index. Preferred are $Sb_2O_5$, $Sb_2O_3$, $SbO_2$, $ZrO_2$, Al-doped ZnO, $TiO_2$, especially $Sb_2O_5$, $ZrO_2$, Al-doped ZnO, $TiO_2$. Particularly, sol of the metal oxide, or sol of a mixture of these metal oxides (e.g., $ZrO_2$—$SnO_2$—$Sb_2O_5$—$SiO_2$ system) are preferred. The metal oxide particles have mean particle size of 10 to 10,000 nm, preferably 10 to 100 nm, especially 10 to 50 nm.

The ratio of 1) binder resin, 2) integrant for enhancing contact angle and 3) integrant for enhancing refractive index, which constitute the intermediate layer, generally is 100:0.1:50 to 100:20:500 (1):2):3)) by weight, preferably 100:0.5:50 to 100:5.0:300. The intermediate layer of the invention is preferably cured product of polyester resin and isocyanate compound as 1), silicone as 2) and metal oxide as 3).

The antireflection layer of the invention generally is a laminated layer of a hard coat layer having lower refractive index than that of the transparent film as a substrate and a low refractive index layer having lower refractive index than that of the hard coat layer; or is a laminated layer of a hard coat layer, a low refractive index and a high refractive index layer provided therebetween. In contrast, the antireflection layer may be a laminated layer of a hard coat layer having higher refractive index than that of the transparent film and a low refractive index layer. In case of provision of a low refractive index, a hard coat layer may have the same refractive index as that of a transparent film.

The antireflection layer may be only a hard coat layer, which shows effective antireflection property. When the transparent film has low refractive index, the antireflection layer may be designed to be a laminated layer of a hard coat layer having higher refractive index than that of a transparent film as a substrate and a low refractive index layer, or a laminated layer of the hard coat layer and the low refractive index layer and further a high refractive index layer.

The hard coat layer is a layer mainly consisting of synthetic resin such as acrylic resin, epoxy resin, urethane resin, silicon resin, etc. The hard coat layer generally has a thickness of 1 to 50 μm, preferably 1 to 10 μm. Though the synthetic resin is generally thermosetting resin or ultraviolet curable resin, ultraviolet curable resin is preferred. The ultraviolet curable resin can be cured for a short time, and hence has excellent productivity.

Examples of the thermosetting resin include phenol resin, resorcinol resin, urea resin, melamine resin, epoxy resin, acrylic resin, urethane resin, furan resin and silicon resin.

Examples of the ultraviolet curable resins (monomers, oligomers) include (meth)acrylate monomers such as 2-hydroxyethyl (meth)acrylate, 2-hydroxyropyl (meth)acrylate, 4-hydroxybutyl (meth)acrylate, 2-ethylhexylpolyethoxy (meth)acrylate, benzyl (meth)acrylate, isobornyl (meth)acrylate, phenyloxyethyl (meth)acrylate, tricyclodecane mono (meth)acrylate, dicyclopentenyloxyethyl (meth)acrylate, tetrahydrofurfuryl (meth)acrylate, acryloylmorpholine, N-vinylcaprolactam, 2-hydroxy-3-phenyloxypropyl (meth)acrylate, o-phenylphenyloxyethyl (meth)acrylate, neopentylglycol di(meth)acrylate, neopentyl glycol dipropoxy di(meth)acrylate, neopentyl glycol hydroxypivalate di(meth)acrylate, tricyclodecanedimethylol di(meth)acrylate, 1,6-hexanediol di(meth)acrylate, nonanediol di(meth)acrylate, trimethylolpropane tri(meth)acrylate, pentaerythritol tri (meth)acrylate, pentaerythritol tetra(meth)acrylate, tris[(meth)acryloxyethyl]isocyanurate and ditrimethylolpropane tetra(meth)acrylate; and the following (meth)acrylate oligomer such as:

polyurethane (meth)acrylate such as compounds obtained by reaction among the following polyol compound and the following organic polyisocyanate compound and the following hydroxyl-containing (meth)acrylate:

the polyol compound (e.g., polyol such as ethylene glycol, propylene glycol, neopentyl glycol, 1,6-hexanediol, 3-methyl-1,5-pentanediol, 1,9-nonanediol, 2-ethyl-2-butyl-1,3-propanediol, trimethylolpropane, diethylene glycol, dipropylene glycol, polypropylene glycol, 1,4-dimethylolcyclohexane, bisphenol-A polyethoxydiol and polytetramethylene glycol; polyesterpolyol obtained by reaction of the above-mentioned polyol with polybasic acid or anhydride thereof such as succinic acid, maleic acid, itaconic acid, adipic acid, hydrogenated dimer acid, phthalic acid, isophthalic acid and terephthalic acid; polycaprolactone polyol obtained by reaction of the above-mentioned polyol with ε-caprolactone; a compound obtained by reaction of the above-mentioned polyol and a reaction product of the above-mentioned polybasic acid or anhydride thereof and ε-caprolactone; polycarbonate polyol; or polymer polyol), and the organic polyisocyanate compound (e.g., tolylene diisocyanate, isophorone diisocyanate, xylylene diisocyanate, diphenylmethane-4,4'-diisocyanate, dicyclopentanyl diisocyanate, hexamethylene diisocyanate, 2,4,4'-trimethylhexamethylene diisocyanate, 2,2',4-trimethylhexamethylene diisocyanate), and the hydroxyl-containing (meth)acrylate (e.g., 2-hydroxyethyl (meth)acrylate, 2-hydroxyropyl (meth)acrylate, 4-hydroxybutyl (meth)acrylate, 2-hydroxy-3-phenyloxypropyl (meth)acrylate, cyclohexane-1,4-dimethylolmono(meth)acrylate, pentaerythritol tri(meth)acrylate or glycerol di(meth)acrylate);

bisphenol-type epoxy(meth)acrylate obtained by reaction of bisphenol-A epoxy resin or bisphenol-F epoxy resin and (meth)acrylic acid.

These compounds can be employed singly or in combination of two or more kinds. The ultraviolet curable resin may be used together with thermo polymerization initiator, i.e., these can be employed as a thermosetting resin.

Photopolymerization initiators of the ultraviolet curable resin can be optionally selected depending upon the properties of the ultraviolet curable resin used. Examples of the photopolymerization initiators include acetophenone type initiators such as 2-hydroxy-2-methyl-1-phenylpropane-1-on, 1-hydroxycyclohexylphenylketone and 2-methyl-1-[4-(methylthio)phenyl]-2-morphorino-propane-1-on; benzoin type initiators such as benzylmethylketal; benzophenone type initiators such as benzophenone, 4-phenylbenzophenone and hydroxybenzophenone; thioxanthone type initiators such as isopropylthioxanthone and 2,4-diethylhioxanthone. Further, as special type, there can be mentioned methylphenylglyoxylate. Especially preferred are 2-hydroxy-2-methyl-1-phenyl-propane-1-on, 1-hydroxycyclohexylphenylketone, 2-methyl-1-[4-(methylthio)phenyl]-2-morphorinopropane-1-on and benzophenone. These photopolymerization initiators can be employed together with one or more kinds of a conventional photopolymerization promoter such as a benzoic acid type compound (e.g., 4-dimethylaminobenzoic acid) or a tertiary amine compound by mixing with the promoter in optional ratio. Only the initiator can be employed singly or in combination of two or more kinds. Especially, 1-hydroxycyclohexylphenylketone (Irgercure 184, available from Chiba-Specialty Chemicals) is preferred.

The initiator is preferably contained in the UV curable resin in the range of 0.1 to 10% by weight, particularly 0.1 to 5% by weight based on the resin composition.

To obtain the hard coat layer, hard polyfunctional monomer such as pentaerythritol tri(meth)acrylate, pentaerythritol tetra(meth)acrylate, dipentaerythritol penta(meth)acrylate, dipentaerythritol hexa(meth)acrylate, trimethylolpropane tri(meth)acrylate, pentaerythritol tri(meth)acrylate, tris[(meth)acryloxyethyl]isocyanurate and/or ditrimethylolpropane tetra(meth)acrylate are preferably used as a main component, which can be selected from the ultraviolet curable resin (monomers, oligomers).

The refractive index of the hard coat layer can be adjusted by utilizing the following materials of the high refractive index layer and low refractive index layer.

The high reflective index layer is preferably a layer (cured layer) in which conductive metal oxide particles (inorganic compound) such as ITO, ATO, $Sb_2O_5$, $Sb_2O_3$, $SbO_2$, $In_2O_3$, $SnO_2$, ZnO, $ZrO_2$, Al-doped ZnO, $TiO_2$ are dispersed in polymer (preferably ultraviolet curable resin). The conductive metal oxide particle generally has mean particle size of 10 to 10,000 nm, preferable 10 to 50 nm. Especially ITO (especially mean particle size of 10 to 50 nm) is preferred. The high reflective index layer preferably has refractive index of not less than 1.64. The thickness generally is in the range of 10 to 500 nm, preferably 20 to 200 nm.

In case the high reflective index layer has a conductive layer, the minimum reflectivity of the surface of the antireflection layer can be reduced to not more than 1.5% by increasing the refractive index of the high reflective index layer to not less than 1.64. Further the minimum reflectivity of the surface of the antireflection layer can be reduced to not more than 1.0% by preferably increasing the reflective index of the high reflective index layer as not less than 1.69, especially 1.69 to 1.82.

The low reflective index layer preferably is a layer (cured layer) in which particles of silica or fluorine resin (preferably hollow silica) are dispersed in polymer (preferably ultraviolet curable resin). The low reflective index layer contains preferably 10 to 60% by weight, especially 10 to 50% by weight of the particles. The low reflective index layer preferably has refractive index of 1.30 to 1.51. The refractive index of more than 1.51 brings about reduction of antireflection property of the antireflection layer. The thickness generally is in the range of 10 to 500 nm, preferably 20 to 200 nm.

The hollow silica preferably has mean particle size of 10 to 100 nm, especially 10 to 50 nm, and specific gravity 0.5 to 1.0, especially 0.8 to 0.9.

The hard coat layer preferably has visible light transmission of not less than 85%. Also, the low and high reflective index layers preferably have visible light transmission of not less than 85%.

In case the antireflection layer is composed of the above-mentioned three layers, for example, it is preferred that the hard coat layer has a thickness of 2 to 20 μm, the high reflective index layer has a thickness of 75 to 200 nm, and the low reflective index layer has a thickness of 75 to 200 nm.

The provision of each of the intermediate layer and the antireflection layer can be carried out, for example, by mixing polymer (e.g., ultraviolet curable resin) with if desired the above-mentioned particles, and applying the resultant coating liquid to the transparent film, and then drying and curing by heating or drying and exposed to ultraviolet rays to be cured. The layers may be applied and cured, respectively, or all the layers may be applied and then cured at one time.

The application can be carried out, for example, by applying a coating liquid (solution) of ultraviolet curable resin including acrylic monomers in a solvent such as toluene by means of gravure coater, and drying, and then exposing to UV rays to cure. This wet-coating method enables high-speed, uniform and cheap film formation. After the coating, for example, the coated layers are exposed to UV rays to be cured whereby the effects of improved adhesion and enhanced hardness of the layer can be obtained. The conductive layer can be formed in the same manner.

In the UV-rays curing, it is possible to adopt, as light source used, various sources generating light in the wavelength range of ultraviolet to visible rays. Examples of the sources include super-high-pressure, high-pressure and low-pressure mercury lamps, a chemical lamp, a xenon lamp, a halogen lamp, a mercury halogen lamp, a carbon arc lamp, and an incandescent electric lamp, and laser beam. The exposing time is generally carried out in the range of a few seconds to a few minutes, depending upon kinds of lamp and strength of light. To promote the curing, the laminate may be heated beforehand for 40 to 120° C., and then the heated laminate may be exposed to ultraviolet rays.

Though the antireflection layer is preferably formed by application (coating) as mentioned above, it may be formed by a vapor film forming method. The high refractive index layer and the low refractive index layer can be formed by means of chemical vapor deposition method (CVD) or physical vapor deposition method (PVD). Examples of the physical vapor deposition method include vacuum deposition method, sputtering method, ion plating method, and laser abrasion method, preferably sputtering method. Examples of the chemical vapor deposition method include ordinary pressure CVD method, reduced pressure CVD method and plasma CVD method.

Examples of combinations of the high and low refractive index layers are described below.

(a) A two-layered laminate of one high refractive index layer and one low refractive index layer;

(b) a four-layered laminate wherein one high refractive index layer and one low refractive index layer are alternately formed by the two layers;

(c) a three-layered laminate of one medium refractive index layer, one high refractive index layer and one low refractive index layer;

(d) a six-layered laminate wherein one high refractive index layer and one low refractive index layer are alternately formed thrice by the two layers.

As the high refractive index layer, a thin film of ITO (tin-indium oxide), ZnO, Al-doped ZnO, $TiO_2$, $SnO_2$, ZrO can be used. Further, as the low refractive index layer, a thin film having refractive index of 1.6 or less, such as a thin layer of $SiO_2$, $MgF_2$, $Al_2O_3$ can be used.

The high refractive index layer and the low refractive index layer can be formed by means of chemical vapor deposition method (CVD) or physical vapor deposition method (PVD). Examples of the physical vapor deposition method include vacuum deposition method, sputtering method, ion plating method, and laser abrasion method, preferably sputtering method. Examples of the chemical vapor deposition method include ordinary pressure CVD method, reduced pressure CVD method and plasma CVD method.

The near-infrared absorption layer is generally obtained by forming a layer containing dye on a surface of the transparent film. The near-infrared absorption layer is prepared by applying a coating liquid containing dye and binder resin or ultraviolet- or electron-beam-curable resin, if desired drying and curing the applied layer. When the near-infrared absorption layer is used as a film, it is generally a near-infrared cut film, such as dye-containing film. The dye generally has absorption maximum in wavelength of 800 to 1200 nm, and its examples include phthalocyanine dyes, metal complexes dyes, nickel dithioren complexes dyes, cyanine dyes, squalirium dyes, polymethine dyes, azomethine dyes, azo dyes, polyazo dyes, diimmonium dyes, aminium dyes, anthraquinone dyes. Preferred are cyanine dyes and squalirium dyes. These dyes can be employed singly or in combination. Examples of the binder resin include thermoplastic resin such as acrylic resin.

In the invention, a neon-emission absorption function may be given to the near-infrared absorption layer such that the near-infrared absorption layer has function for adjusting color hue. For this purpose, a neon-emission absorption layer may be provided. However, the near-infrared absorption layer may contain a neon-emission selective absorption dye.

Examples of the neon-emission selective absorption dyes include cyanine dyes, squalirium dyes, anthraquinone dyes, phthalocyanine dyes, polymethine dyes, polyazo dyes, azulenium dyes, diphenylmethane dyes, triphenylmethane dyes. The neon-emission selective absorption dyes are required to have neon-emission selective absorption function at wavelength of approx. 585 nm and small absorption in a wavelength range of visible light except the wavelength. Hence, the dyes preferably have absorption maximum wavelength of 575 to 595 nm, and half bandwidth of absorption spectrum of 40 nm or less.

In case a plurality of absorption dyes including dyes for absorbing near-infrared light and dyes for absorbing neon emission light are used, if there are difficulties in terms of solubility of the dyes, if there are undesirable reactions among the mixed dyes, and if there is deterioration of thermal resistance or moisture resistance, it is not necessary for all the absorption dyes to be contained in the same layer, and the absorption dyes may be contained in different layers in such a case.

Further, coloring materials, ultraviolet absorbers, and antioxidants may be added as long as those materials adversely affect the optical properties of the filter.

As the near-infrared absorption properties of the optical filter of the invention, the transmittance of light in a wavelength range of 850 to 1000 nm preferably is 20% or lower, more preferably, 15% or lower. As the selective absorption properties of the optical filter, the transmittance of light at a wavelength of 585 nm preferably is 50% or lower. In the former, a transmittance of light existing in the wavelength range can be reduced, the wavelength range being thought to be a cause of malfunction of remote control systems in peripheral devices. In the latter, since orange light having peak wavelength in the range of 575 to 595 nm deteriorates color reproductivity, the wavelength of orange light is absorbed whereby red light is rendered more intrinsic and as a result, reproducibility of colors can be improved.

The near-infrared absorption layer generally has thickness of 0.5 to 50 μm.

The adhesive layer of the invention is used to bond the optical filter of the invention to a display, and therefore any resin having adhesion function can be used as materials for forming the adhesive layer. Examples of the materials include acrylic adhesives made of butyl acrylate and the like, rubber adhesives, TPE (thermoplastic elastomer) adhesives comprising as main component TPE such as SEBS (styrene/ethylene/butylene/styrene) and SBS (styrene/butadiene/styrene).

The thickness of the transparent adhesive layer generally is in the range of 5 to 500 μm, preferably in the range of 10 to 100 μm. The optical filter can be generally bonded to a glass plate of a display through the adhesive layer under application of pressure and heat.

In case of using two transparent films in the invention, examples of materials (adhesives) used in the adhesion of the films include ethylene/vinyl acetate copolymer, ethylene/methyl acrylate copolymer, acrylic resin (e.g., ethylene/(meth)acrylic acid copolymer, ethylene/ethyl (meth)acrylate copolymer, ethylene/methyl (meth)acrylate copolymer, metal-ion crosslinked ethylene/(meth)acrylic acid copolymer), and ethylene copolymers such as partially saponified ethylene/vinyl acetate copolymer, carboxylated ethylene/vinyl acetate copolymer, ethylene/(meth)acrylic acid/maleic anhydride copolymer, ethylene/vinyl acetate/(meth)acrylate copolymer. The (meth)acrylic acid means acrylic acid and methacrylic acid and the (meth)acrylate means acrylate and meth acrylate. Besides these polymers, there can be mentioned polyvinyl butyral (PVB) resin, epoxy resin, phenol resin, silicon resin, polyester resin, urethane resin, rubber adhesives, thermoplastic elastomer (TPE) such as SEBS (styrene/ethylene/butylene/styrene) and SBS (styrene/butadiene/styrene). The acrylic adhesives and epoxy resins are preferred because they show excellent adhesion.

The thickness of the above-mentioned adhesive layer generally is in the range of 10 to 50 μm, preferably in the range of 20 to 30 μm. The optical filter can be generally attached to a glass plate of a display through the adhesive layer by application of pressure and heat.

In case EVA (ethylene/vinyl acetate/ethylene copolymer) is used as materials of the transparent adhesive layer, EVA generally has the content of vinyl acetate in an amount of 5 to 50% by weight, especially 15 to 40% by weight. When the content is less than 5% by weight, the layer does not show satisfactory transparency. On the other hand, when the content is more than 50% by weight, the layer extremely reduces in mechanical strength not to increase difficulty of film formation and occurrence of blocking between films.

As a crosslinking agent for thermo crosslinking, an organic peroxide is generally suitable. The organic peroxide is selected in the consideration of sheet-processing temperature, curing (bonding) temperature, and storage stability. Examples of the organic peroxide include 2,5-dimethylhexane-2,5-dihydroperoxide, 2,5-dimethyl-2,5-(t-butylperoxy)hexyne-3, di-t-butylperoxide, t-butylcumyl peroxide, 2,5-dimethyl-2,5-di(t-butylperoxy)hexane, dicumyl peroxide, α,α'-bis(t-butylperoxyisopropyl)benzene, n-butyl-4,4-bis(t-butylperoxy)valerate, 2,2-bis(t-butylperoxy)butane, 1,1-bis(t-butylperoxy)cyclohexane, 1,1-bis(t-butylperoxy)-3,3,5- trimethylcyclohexane, t-butylperoxybenzoate, benzoyl peroxide, t-butylperoxyacetate, 2,5-dimethylhexyl-2,5-bis(t-butylperoxy)hexyne-3, 1,1-bis(t-butylperoxy)-3,3,5-trimethylcyclohexane, 1,1-bis(t-butylperoxy)cyclohexane, methyl ethyl ketone peroxide, 2,5-dimethylhexyl-2,5-bisperoxybenzoate, t-butylhydroperoxide, p-menthane hydroperoxide, p-chlorobenzoyl peroxide, t-butylperoxyisobutylate, hydroxyheptyl peroxide and chlorohexanone peroxide. The organic peroxide can be used singly, or in combination of two or more kinds. The content of the organic peroxide is generally used in an amount of not more than 5 parts by weigh, preferably 0.5 to 5 parts by weight based on 100 parts by weight of EVA.

The organic peroxide is generally kneaded with EVA by means of an extruder or roll mill. However it may be solved in an organic solvent, plasticizer, vinyl monomer and added to an EVA film by means of impregnation method.

The EVA may contain acryloyl group-containing compounds, methacryloyl group-containing compounds, allyl group-containing compounds for improvement of various properties of EVA (e.g., mechanical strength, optical characteristics, adhesive property, weather resistance, whitening resistance, rate of crosslinking).

Examples of the acryloyl and methacryloyl group-containing compounds include generally derivatives of acrylic acid or methacrylic acid, such as esters and amides of acrylic acid or methacrylic acid. Examples of the ester residue include linear alkyl groups (e.g., methyl, ethyl, dodecyl, stearyl and lauryl), a cyclohexyl group, a tetrahydrofurfuryl group, an aminoethyl group, a 2-hydroxyethyl group, a 3-hydroxypropyl group, 3-chloro-2-hydroxypropyl group. Further, the esters include esters of acrylic acid or methacrylic acid with polyhydric alcohol such as ethylene glycol, triethylene glycol, polypropylene glycol, polyethylene glycol, trimethylol propane or pentaerythritol. Example of the amide includes diacetone acrylamide.

Examples of the esters include polyfunctional esters of acrylic acids or methacrylic acids with polyhydric alcohol such as glycerol, trimethylol propane or pentaerythritol; and further allyl group-containing compounds such as triallyl cyanurate, triallyl isocyanurate, diallyl phthalate, diallyl isophthalate and diallyl maleate. The compounds can be used singly, or in combination of two or more kinds. The content of the compound is generally used in an amount of 0.1 to 2 parts by weight, preferably 0.5 to 5 parts by weight based on 100 parts by weight of EVA.

In case EVA is cured by light, sensitizer (photoinitiator) is used instead of the organic peroxide, and it is generally used in an amount of not more than 5 parts by weigh, preferably 0.1 to 3.0 parts by weight based on 100 parts by weight of EVA.

Examples of the sensitizer include benzoin, benzophenone, benzoyl methyl ether, benzoin ethyl ether, benzoin isopropyl ether, benzoin isobutyl ether, dibenzyl, 5-nitroacenaphtene, hexachlorocyclopentadiene, p-nitrodiphenyl, p-nitroaniline, 2,4,6-trinitroaniline, 1,2-benzanthraquinone, 3-methyl-1,3-diaza-1,9-benzanthrone. The photoinitiators can be used singly, or in combination of two or more kinds.

In the invention, a silane coupling agent may be used to accelerate adhesion. Examples of the silane coupling agent include vinylethoxysilane, vinyltris(β-methoxyethoxy)silane, γ-(methacryloxypropyl)trimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, γ-chloropropylmethoxysilane, vinyltrichlorosilane, γ-mercaptopropylmethoxysilane, γ-aminopropyltriethoxysilane, N-β-(aminoethyl)-γ-aminopropyltrimethoxysilane.

The silane coupling agent can be used singly, or in combination of two or more kinds. The content of the silane coupling agent is generally in an amount of 0.001 to 10 parts by weight, preferably 0.01 to 5 parts by weight based on 100 parts by weight of EVA.

The EVA adhesive layer of the invention can further contain a small amount of ultraviolet absorbing agent, infrared absorbing agent, age stabilizer (antioxidant), paint processing aid and colorant. If appropriate, filler such as carbon black, hydrophobic silica or calcium carbonate may be contained.

The adhesive layer for adhesion can be obtained, for example, by mixing EVA with the above-mentioned additives and kneaded by means of extruder or roll, and then forming the sheet having a predetermined shape by film formation method using calendar, roll, T-die extrusion or blowing.

A protective layer may be provided on the antireflection layer. The protective layer is preferably formed in the same manner as in the hard coat layer.

Materials for the release sheet provided on the transparent adhesive layer is generally transparent polymers having glass transition temperature of not less than 50° C. Examples of the materials include polyester resin (e.g., polyethylene terephthalate, polycyclohexylene terephthalate, polyethylene naphthalate), polyamide (e.g., nylon 46, modified nylon 6T, nylon MXD6, polyphthalamide), ketone resin (e.g., polyphenylene sulfide, polythioether sulfone), sulfone resin (e.g., polysulfone, polyether sulfone), polyether nitrile, polyarylate, polyether imide, polyamideimide, polycarbonate, polymethyl methacrylate, triacetylcellulose, polystyrene or polyvinyl chloride. Of these resins, polycarbonate, polymethyl methacrylate, polyvinyl chloride, polystyrene and polyethylene terephthalate can be preferably employed. The thickness is generally in the range of 10 to 200 μm, especially in the range of 30 to 100 μm.

The optical filter for display of the invention is obtained, for example, by forming on one surface of a continuous transparent film, an intermediate layer, a mesh-shaped conductive layer, and forming a near-infrared absorption layer and a transparent adhesive layer on the other surface of the continuous transparent film. Each of the layers may be formed in continuously or batch wise. The resultant continuous composite is cut. Examples of coaters for applying each layers onto the film include slit die, lip die, lip reverse. In case both sides of the film are applied at the same time, a both-faces simultaneously-coating machine wherein lip dies are arranged on both sides (both-faces) of the film is generally used.

The optical filter for display of the invention prepared in such manner is used to be attached onto a surface of an image-displaying glass plate of a display such as PDP.

In PDP of the invention, since the optical filter has a plastic film as a substrate, it is possible to directly attach the optical filter to the surface of the glass plate of the PDP. Therefore, PDP itself can be reduced in weight, thickness and cost, especially in case of using one transparent film. Further, compared with PDP having a front plate of a transparent molded body in front of the PDP, PDP provided with the optical filter of the invention enables the removal of an air layer between PDP and a filter for PDP can be removed and hence resolves the increase of visible-rays reflectivity caused by the interface reflection and the occurrence of the double reflection. Thereby PDP of the invention can be improved in visibility.

Thus, the display provided with the optical filter of the invention has excellent antireflection property and antistatic property, and generates little radiation of dangerous electromagnetic wave, and further is easily viewable, and free from dust attachment.

EXAMPLE

The invention is illustrated in detail using the following Examples and Comparative Examples. The invention is not restricted by the following Examples.

Example 1

<Preparation of Optical Filter for Display>
(1) Formation of Intermediate Layer

A coating liquid for intermediate layer having the following formulation was applied onto a surface of a continuous polyethylene terephthalate (PET) film having thickness of 100 μm (width of 600 mm, length of 100 μm), dried and cured at 100° C. for three minutes to form an intermediate layer having a thickness of 80 nm. The resultant intermediate layer had refractive index of 1.65.

Formulation:

| | |
|---|---|
| Polyester resin (Trade name: AD335-AE, available from TOYO INK MFG. CO., LTD; 40 wt. % of resin, 30 wt. % of toluene, 30 wt. % of ethyl acetate) | 50 weight parts |
| Polyisocyanate (Trade name: CAT-10L, available from TOYO INK MFG. CO., LTD; 52.5 wt. % of polyisocyanate, 47.5 wt. % of MEK) | 5 weight parts |
| Silicone (Trade name: KF96-20CS, available from Shin-Etsu Chemical Co., Ltd.; nonvolatile content;: 100 wt. %) | 0.03 weight part |
| ZrO$_2$-methyl isobutyl ketone dispersing liquid (Trade name: ZRMIBK 15 WT %-E02, available from C. I. KASEI CO., LTD., nonvolatile content: 15 wt. %) | 75 weight parts |
| Cyclohexanone | 2000 weight parts |

(2) Formation of Mesh-shaped Metal Conductive Layer

On the intermediate layer of the continuous polyethylene terephthalate film, a polyvinyl alcohol aqueous solution (20%) was printed in dot pattern. A shape of each of the dots was square having a side of 234 μm, a distance between the dots was 20 μm, and the arrangement of the dots was in the form of square grid (lattice). The printed thickness was approx. 5 μm after drying.

On the PET film having dot pattern, copper was vacuum-deposited to form a copper layer having mean thickness of 4 μm. Subsequently, the PET film having dot pattern and copper layer was immersed in room-temperature water and the dots were dissolved and removed by rubbing with sponge, and then the PET film was rinsed with water, dried to form a mesh-shaped conductive layer on the surface of the PET film.

The metal conductive layer on the PET film showed pattern of square grid (mesh) precisely corresponding to negative pattern of the dot pattern. The line width of the mesh was 20 μm, and the opening ratio was 83.6%. Further mean thickness of the conductive layer (copper layer) was 4 μm.

(3) Formation of Hard Coat Layer
The following formation:

| | |
|---|---|
| Dipentaerythritol hexaacrylate (KAYARAD DPHA, Nippon Kayaku Co., Ltd.) | 50 weight parts |
| Zirconia (ZrO$_2$—SnO$_2$—Sb$_2$O$_5$—SiO$_2$ methanol dispersion; Trade name: San colloid HZ-307M6, available from Nissan Chemical Industries, Ltd. nonvolatile content: 30.5 wt. %) | 500 weight parts |
| Methyl ethyl ketone | 100 weight parts |
| Irgacure 184 (Available from Ciba specialty chemicals) | 8 weight parts | was mixed to form a coating liquid, which was applied onto a surface of the mesh-shaped conductive layer with a bar coater, and cured by UV irradiation. Hence, a hard coat layer having thickness of 5 μm (refractive index: 1.65) was formed on the mesh-shaped conductive layer.

(3) Formation of Low Refractive Index Layer
The following composition:

| | |
|---|---|
| Opster JN-7212 (Available from JSR) | 100 weight parts |
| Methyl ethyl ketone | 117 weight parts |
| Methyl isobutyl ketone | 117 weight parts | was mixed to form a coating liquid, which was applied onto a surface of the hard coat layer with a bar coater, and dried in an oven at 80° C. for five minutes, and then cured by UV irradiation. Hence, a low refractive index layer having thickness of 90 nm (refractive index: 1.42) was formed on the hard coat layer.

Thus, an optical filter for display was obtained.

Example 2

Procedures of Example 1 were repeated except that an intermediate layer was formed by using the following formulation to prepare an optical filter for display.

Formulation:

| | |
|---|---|
| Polyester resin (Trade name: TM-K55, available from TOYO INK MFG. CO., LTD; 30 wt. % of resin, 70 wt. % of methyl ethyl ketone) | 50 weight parts |
| Polyisocyanate (Trade name: CAT-10L, available from TOYO INK MFG. CO., LTD; 52.5 wt. % of polyisocyanate, 47.5 wt. % of MEK) | 5 weight parts |
| Silicone (Trade name: KF96-20CS, available from Shin-Etsu Chemical Co., Ltd.; nonvolatile content;: 100 wt. %) | 0.03 weight part |
| ZrO$_2$-methyl isobutyl ketone dispersing liquid (Trade name: ZRMIBK 15 WT %-E02, available from C. I. KASEI CO., LTD., nonvolatile content: 15 wt. %) | 75 weight parts |
| Cyclohexanone | 2000 weight parts |

Comparison Example 1

Procedures of Example 1 were repeated except that an intermediate layer was formed by using the following formulation to prepare an optical filter for display.

Formulation:

| | |
|---|---|
| Polyester resin (Trade name: AD335-AE, available from TOYO INK MFG. CO., LTD; 40 wt. % of resin, 30 wt. % of toluene, 30 wt. % of ethyl acetate) | 50 weight parts |
| Polyisocyanate (Trade name: CAT-10L, available from TOYO INK MFG. CO., LTD; 52.5 wt. % of polyisocyanate, 47.5 wt. % of MEK) | 5 weight parts |

-continued

| | |
|---|---|
| ZrO$_2$-methyl isobutyl ketone dispersing liquid (Trade name: ZRMIBK 15 WT %-E02, available from C. I. KASEI CO., LTD., nonvolatile content: 15 wt. %) | 75 weight parts |
| Cyclohexanone | 2000 weight parts |

Comparison Example 2

Procedures of Example 1 were repeated except that an intermediate layer was formed by using the following formulation to prepare an optical filter for display.

Formulation:

| | |
|---|---|
| Polyester resin (Trade name: AD335-AE, available from TOYO INK MFG. CO., LTD; solution of 40 wt. % of resin, 30 wt. % of toluene, 30 wt. % of ethyl acetate) | 50 weight parts |
| Polyisocyanate (Trade name: CAT-10L, available from TOYO INK MFG. CO., LTD; solution of 52.5 wt. % of polyisocyanate, 47.5 wt. % of MEK) | 5 weight parts |
| Silicone (Trade name: KF96-20CS, available from Shin-Etsu Chemical Co., Ltd.; nonvolatile content;: 100 wt. %) | 1.6 weight part |
| Cyclohexanone | 2000 weight parts |

Comparison Example 3

Procedures of Example 1 were repeated except that an intermediate layer was formed by using a formulation obtained by eliminating the polyisocyanate from the formulation for intermediate layer of Example 1 to prepare an optical filter for display.

Example 3

Procedures of Example 1 were repeated except that the following layers were further provided to prepare an optical filter for display.

(4) Formation of Near-infrared Absorption Layer (Having Color Hue Adjusting Function)

The following composition:

| | |
|---|---|
| Polymethyl methacrylate | 30 weight parts |
| TAP-2 (available from Yamada Chemical Co., Ltd.) | 0.4 weight part |
| Plast Red 8330 (available from Arimoto Chemical Co., Ltd.) | 0.1 weight part |
| CIR-1085 (available from Japan Carlit Co., Ltd.) | 1.3 weight part |
| IR-10A (available from Nippon Syokubai Co., Ltd.) | 0.6 weight part |
| Methyl ethyl ketone | 152 weight parts |
| Methyl isobutyl ketone | 18 weight parts | was mixed to form a coating liquid, which was applied onto the reverse side of the PET film with a bar coater, and dried in an oven at 80° C. for five minutes. Hence, a near-infrared absorption layer provided with color hue adjusting function having thickness of 5 μm was formed on the reverse side of PET film.

(5) Formation of Adhesive Layer

The following composition:

| | |
|---|---|
| SK Dyne 1811L (Available from Soken Chemical & Engineering Co., Ltd.) | 100 weight parts |
| Hardener L-45 (Available from Soken Chemical & Engineering Co., Ltd.) | 0.45 weight part |
| Toluene | 15 weight parts |
| Ethyl acetate | 4 weight parts | was mixed to form a coating liquid, which was applied onto the near-infrared absorption layer with a bar coater, and dried in an oven at 80° C. for five minutes. Hence, a transparent adhesive layer having thickness of 25 μm was formed on the near-infrared absorption layer.

Thus, an optical filter for display was obtained.

The resultant optical filters for display were evaluated in the following manner.

[Evaluation of Optical Filter]

(1) Refractive Index

Each of the layers of Examples and Comparison Examples is formed on a glass plate in the same manner, and the resultant film is peeled from the glass plate to prepare a sample (film). Refractive index of the sample is measured according to JIS Z 8120 (2001).

(2) Contact Angle

Each of the layers of Examples and Comparison Examples is formed on a glass plate in the same manner, and the resultant film is peeled from the glass plate to prepare a sample (film). Contact angle of the sample is measured according to JIS R 3257-01 (1999).

(3) Interference Fringe

Each of the layers of Examples and Comparison Examples is attached onto an image displaying surface of PDP with an adhesive. The image displaying surface is exposed to light from a three-wavelength-type fluorescent lamp (Trade name: FHF32EX-N, available from TOSHIBA CORPOLATION) and it is visually confirmed whether interference fringe occurs on the image displaying surface or not. The evaluation is carried out as follows:

◯: Interference fringe is not observed x: Interference fringe is not observed (4) Shape of Each of Dots Dots of PVA formed in each of Examples and Comparison Examples are visually observed and shape of dots is evaluated as follows:

◯: Dots are sharp-cut x: Dots are vaguely-outlined (5) Solvent Resistance

A laminate obtained by forming an intermediate layer and a mesh-shaped conductive layer on a transparent film (i.e., a laminate before formation of hard coat layer) is prepared, and absorbent cotton saturated with methyl ethyl ketone is placed on the mesh-shaped conductive layer and the absorbent cotton is reciprocated 20 times at distance of 5 cm under load of 100 g. The condition of the surface of the mesh-shaped conductive layer is evaluated as follows:

◯: Change of the surface is not observed x: Whitening of the surface is observed (6) Haze The haze value of the resultant optical filter is determined by using Full Automatic Direct-Reading Haze Computer HGM-2DP manufactured by Suga Shikenki K. K. according to JIS K 7105 (1981).

(7) Opening Ratio

The opening ratio (aperture ratio) of the mesh-shaped conductive layer means the proportion of the area of the opening portion of the layer to the projected area of the layer.

The obtained results were shown in Table 1.

TABLE 1

|  | Contact angle of intermediate layer | Refractive index of intermediate layer | Interference fringe | Dot shape | Solvent resistance | Haze | Opening ratio |
|---|---|---|---|---|---|---|---|
| Example 1 | 80° | 1.65 | ○ | ○ | ○ | 4.0 | 84% |
| Example 2 | 80° | 1.65 | ○ | ○ | ○ | 4.1 | 84% |
| Co. Ex. 1 | 45° | 1.65 | ○ | X | ○ | 4.0 | 49% |
| Co. Ex. 2 | 80° | 1.54 | X | ○ | ○ | 4.0 | 84% |
| Co. Ex. 3 | 80° | 1.65 | ○ | ○ | X | 15.2 | 84% |

The PDP filters obtained in Examples 1 and 2 are excellent in occurrence of interference fringe, dot shape, haze and opening ratio.

PDP provided with the filter of Example 3, in which a near-infrared absorption layer and adhesive layer are provided on the filter of Example 1, showed excellent electromagnetic wave shielding property, high transparency and brilliantly-colored property.

INDUSTRIAL APPLICABILITY

The optical filter for display of the invention can be easily prepared, is thin and light, and has excellent electromagnetic wave shielding property and antireflection property, and further scarcely suffers from occurrence of interference fringe. Thus, the optical filter for display of the invention can be advantageously used for adding various functions such as antireflection, near-infrared shielding and electromagnetic wave shielding to various displays such as plasma display panel (PDP), cathode-ray-tube (CRT) display, liquid crystal display, organic EL (electroluminescence) display, field emission display (FED) including surface-conduction electron-emitter display (SED).

What is claimed is:

1. An optical filter for display comprising at least one transparent film, a mesh-shaped conductive layer provided on the one transparent film, and a hard coat layer provided on the mesh-shaped conductive layer,
   wherein an intermediate layer is further provided between the transparent film and the mesh-shaped conductive layer, and the intermediate layer has refractive index of 1.60 to 1.80 and contact angle of 70 to 100 degrees.

2. An optical filter for display comprising a transparent film, a mesh-shaped conductive layer and a hard coat layer provided on one side of the transparent film in this order, and a near-infrared absorption layer provided on the other side of the transparent film,
   wherein an intermediate layer is further provided between the transparent film and the mesh-shaped conductive layer, and the intermediate layer has refractive index of 1.60 to 1.80 and contact angle of 70 to 100 degrees.

3. An optical filter for display as defined in claim 1, wherein the refractive index of the intermediate layer is in the range of 1.60 to 1.70.

4. An optical filter for display as defined claim 1, wherein the contact angle of the intermediate layer is in the range of 70 to 90 degrees.

5. An optical filter for display as defined in claim 1, which has haze value of not more than 5%.

6. An optical filter for display as defined in claim 1, wherein the intermediate layer contains polyester urethane resin, silicone and metal oxide.

7. An optical filter for display as defined in claim 6, wherein the polyester urethane resin is a cured product obtained from polyester resin and isocyanate compound.

8. An optical filter for display comprising at least one transparent film, a mesh-shaped conductive layer provided on the one transparent film, and a hard coat layer provided on the mesh-shaped conductive layer,
   wherein an intermediate layer is further provided between the transparent film and the mesh-shaped conductive layer, and the intermediate layer is a cured product obtained from a mixture comprising polyester resin, isocyanate compound, silicone and metal oxide.

9. An optical filter for display comprising a transparent film, a mesh-shaped conductive layer and a hard coat layer provided on one side of the transparent film in this order, and a near-infrared absorption layer provided on the other side of the transparent film,
   wherein an intermediate layer is further provided between the transparent film and the mesh-shaped conductive layer, and the intermediate layer is a cured product obtained from a mixture comprising polyester resin, isocyanate compound, silicone and metal oxide.

10. An optical filter for display as defined in claim 8, wherein the isocyanate compound is polyisocyanate having two or more isocyanate groups in its molecule.

11. An optical filter for display as defined in claim 1, wherein the mesh-shaped conductive layer has a thickness of 1 to 10 μm.

12. An optical filter for display as defined in claim 1, wherein the mesh-shaped conductive layer includes a vapor-deposited layer of metal.

13. An optical filter for display as defined in claim 1, wherein a low refractive index layer having refractive index lower than that of the hard coat layer is formed on the hard coat layer.

14. An optical filter for display as defined in claim 2, wherein an adhesive layer is provided on the side opposite to the transparent film side of the near-infrared absorption layer.

15. An optical filter for display as defined in claim 2, wherein the near-infrared absorption layer has adherence property.

16. An optical filter for display as defined in claim 1, wherein the transparent film is a plastic film.

17. An optical filter for display as defined in claim 14, wherein a release sheet is provided on the adhesive layer or the near-infrared absorption layer having adherence property.

18. An optical filter for display as defined in claim 1, which is an optical filter for plasma display panel.

19. An optical filter for display as defined in claim 1, which is attached onto a surface of a glass plate for displaying image.

20. A plasma display panel wherein the optical filter for display as defined in claim 1 is attached onto a surface of a glass plate for displaying image.

* * * * *